United States Patent [19]
Chengson

[11] Patent Number: 5,793,259
[45] Date of Patent: Aug. 11, 1998

[54] APPARATUS FOR GENERATING DIFFERENTIAL NOISE BETWEEN POWER AND GROUND PLANES

[75] Inventor: David Chengson, Aptos, Calif.

[73] Assignee: Silicon Graphics, Inc., Mountain View, Calif.

[21] Appl. No.: 879,957

[22] Filed: Jun. 20, 1997

[51] Int. Cl.$^6$ .......................... H03B 29/00; H01H 31/02
[52] U.S. Cl. .................................... 331/78; 324/537
[58] Field of Search .................... 331/44, 78, 96, 331/172; 324/537, 613, 765; 438/17

[56] References Cited

U.S. PATENT DOCUMENTS

| | | | |
|---|---|---|---|
| 5,514,971 | 5/1996 | Hankui et al. | 324/639 |
| 5,668,507 | 9/1997 | Boerstler et al. | 331/78 |

*Primary Examiner*—David Mis
*Attorney, Agent, or Firm*—Wagner, Murabito & Hao

[57] ABSTRACT

The present invention provides an apparatus for generating a differential noise between a power and ground planes in a printed wiring board (PWB). The apparatus comprises a power plane, a ground plane, and a signal transmission circuit. A plurality of cuts comprising a first pattern is formed on the power plane. The ground plane also provides a plurality of cuts comprising a second pattern. Both the power plane and the ground plane are disposed in the PWB. A signal transmission circuit transmits a signal current over the ground plane and the power plane. The signal current induces an image return current on both the power plane and the ground plane. The first and second patterns of cuts on the power plane and the ground plane, respectively, disrupt the image return current and cause a differential voltage noise to be generated between the power plane and the ground plane.

38 Claims, 8 Drawing Sheets

APPARATUS FOR GENERATING DIFFERENTIAL NOISE BETWEEN POWER AND GROUND PLANES

FIELD OF THE INVENTION

The present claimed invention relates to the field of noise generating apparatus. More particularly, the present claimed invention relates to generating differential noise between power and ground planes in a printed wiring board.

BACKGROUND ART

In a digital or computer system, the analog and digital components are typically packaged on a printed wiring board (PWB). Essentially, the PWB is comprised of a dielectric structure layered and wired to allow electronic components to be supported mechanically and connected internally to each other and externally to outside circuits. The dielectric typically comprises multiple layers of organic and inorganic materials.

A typical PWB includes, among others, power and ground planes for establishing reference points for signal lines. For example, the power and ground planes form reference AC ground planes for AC signals. Further, the power and ground planes stabilize voltage levels for both analog and digital components on the PWB by minimizing large voltage drops between a power supply and the components.

High speed digital and computer systems generally include analog components such as phase-locked loops (PLLs), oscillators such as crystals and surface acoustic wave (SAW) devices, clocks, and other analog integrated chips (ICs). These analog devices perform the fundamental function of regulating and synchronizing the timing of various system components. Hence, their durability is critical to the performance of a digital or computer system.

However, digital and computer systems typically produce digital noise that may adversely affect the performance of the analog components. For example, the system may generate switching output noise, noise emanating from forward and backward crosstalk, reflection noise due to packaging and connectors, and power and ground noise. These noise sources often induce the sensitive analog components to generate clock jitter, which is a form of clock uncertainty. Since clock jitter reduces system performance, much effort has been made to test the sensitivity of analog components by generating and injecting noise into the analog components.

Traditionally, AC coupled techniques were used to inject noise to test analog components on a PWB. One method uses an inductor (i.e., transformer) to couple AC signals to generate noise. Prior Art FIG. 1A illustrates a noise injection circuit, which injects noise through a transformer 102. In this circuit configuration, a DC voltage 112 is applied between the power plane 106 and the ground plane 108. An analog component 110 to be tested is coupled between the power plane 106 and the ground plane 108. The transformer 102 is coupled to the power plane 106. The transformer 102 can also be coupled to the ground plane 108 in a similar manner as described for the power plane 106. An AC voltage 104 is then applied to the transformer 102, which converts the AC voltage signal into noise. This noise is then applied across the analog component 110 to test its sensitivity to various frequencies.

Unfortunately, the inductive coupling technique with a transformer has frequency limitations. The transformer acts as a bandpass filter and cannot effectively couple noise at high frequencies. When less windings are used, the transformer frequency response improves. However, the improvement comes at the expense of amplitude. That is, the amplitude of the AC coupled signal is reduced. Hence, over frequencies of about 100 kHz, transformers are not effective in AC coupling noise into power or ground planes as the resultant amplitude of the coupled signal is small.

Another method uses a capacitor to couple AC signals to inject noise into the analog devices. Prior Art FIG. 1B illustrates a noise injection circuit which injects noise through a capacitor 152. In this circuit configuration, a DC voltage 162 is applied between the power plane 156 and the ground plane 158. An analog component 160 to be tested is coupled between the power plane 156 and the ground plane 158. The capacitor 152 is coupled to the power plane 106. Similarly, the capacitor 152 can also be coupled to the ground plane 158 to capacitively couple noise into the ground plane 158. An AC voltage 154 is then applied to the transformer 102, which converts the AC voltage signal into noise. This noise is then applied across the analog component 150 to test the sensitivity to various frequencies.

Unfortunately, the capacitor coupled method also encounters frequency limitations. The capacitively coupled signals with large amplitudes require large quantities of coulombs. The larger the capacitor value, the larger the coulomb storing capacity. Hence, it is desirable to have a large capacitor to AC couple a signal. However, the frequency at which the most energy can be capacitively coupled is the resonant frequency of the capacitor. Since the resonant frequency of a capacitor is inversely proportional to the capacitor value, large signals at high frequencies are difficult to generate with a capacitor.

Thus, what is needed is an apparatus for generating noise across a broad range of frequencies and amplitudes, which can be controlled deterministically. The present invention provides one solution that meets these needs.

SUMMARY OF THE INVENTION

The present invention provides an apparatus for generating a differential noise between power and ground planes in a printed wiring board (PWB). The apparatus comprises a power plane, a ground plane, and a signal transmission circuit. A plurality of cuts comprising a first pattern is formed on the power plane. The ground plane also provides a plurality of cuts comprising a second pattern. Both the power plane and the ground plane are disposed in the PWB. A signal transmission circuit transmits a signal current over the ground plane and the power plane. The signal current induces an image return current on both the power plane and the ground plane. The first and second patterns of cuts on the power plane and the ground plane, respectively, disrupt the image return current and cause differential voltage noise to be generated between the power plane and the ground plane. This noise can then be injected into an analog component to test its frequency sensitivity.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

DESCRIPTION OF THE PREFERRED EMBODIMENTS

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

The present invention, an apparatus for generating differential noise on a printed wiring board (PWB), creates deterministic noise differentially on power and ground planes in the PWB. The preferred embodiment is implemented in a PWB by serpentining a power plane and a ground plane in a particular pattern. A signal is routed across the power and ground planes having a serpentine pattern of cuts. The signal induces an image return current on the serpentine planes. The serpentine cuts in the planes disrupt the image return current and thereby generate noise in the power and ground planes.

The noise thus generated can be used, among others, to test an analog component to be used in a digital or computer system. The noise generated in the power and ground structures is injected into an analog component to test its frequency sensitivity. Once the sensitive frequency has been determined, designers can eliminate the analog component's sensitivity to the particular frequency by modifying the design of the component or by adding other components. Although the present invention applies to testing of analog components, those skilled in the art will appreciate that it can be readily adapted for various other applications where noise generation can be utilized.

Figure 1A:
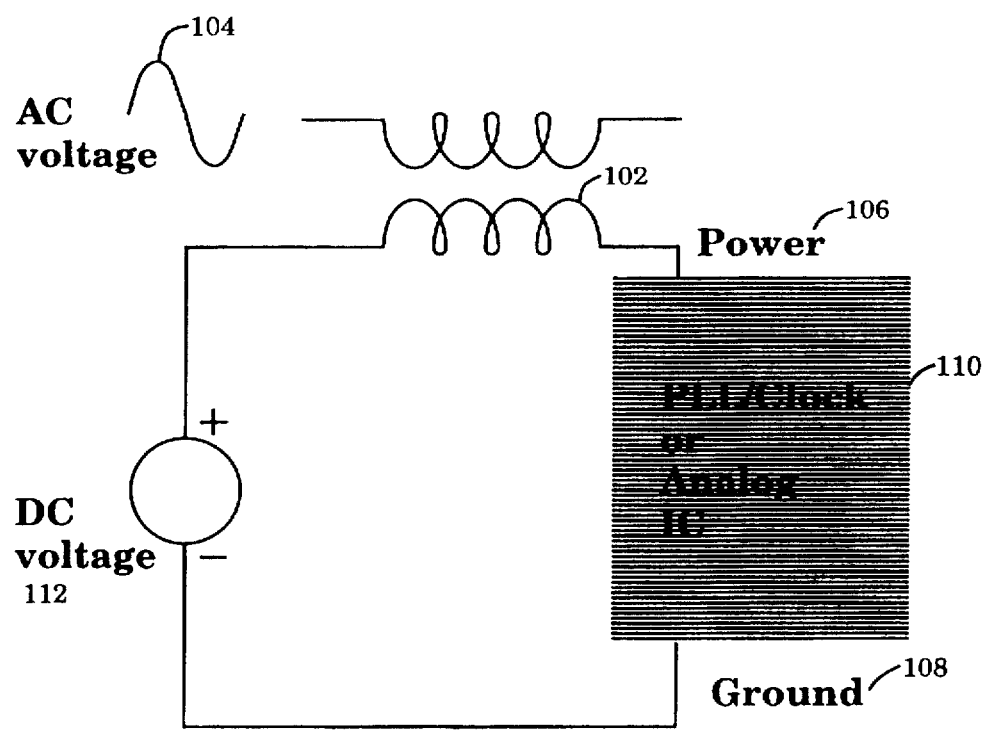
FIG. 1A illustrates a noise injection circuit, which injects noise through a transformer.
Figure 1B:
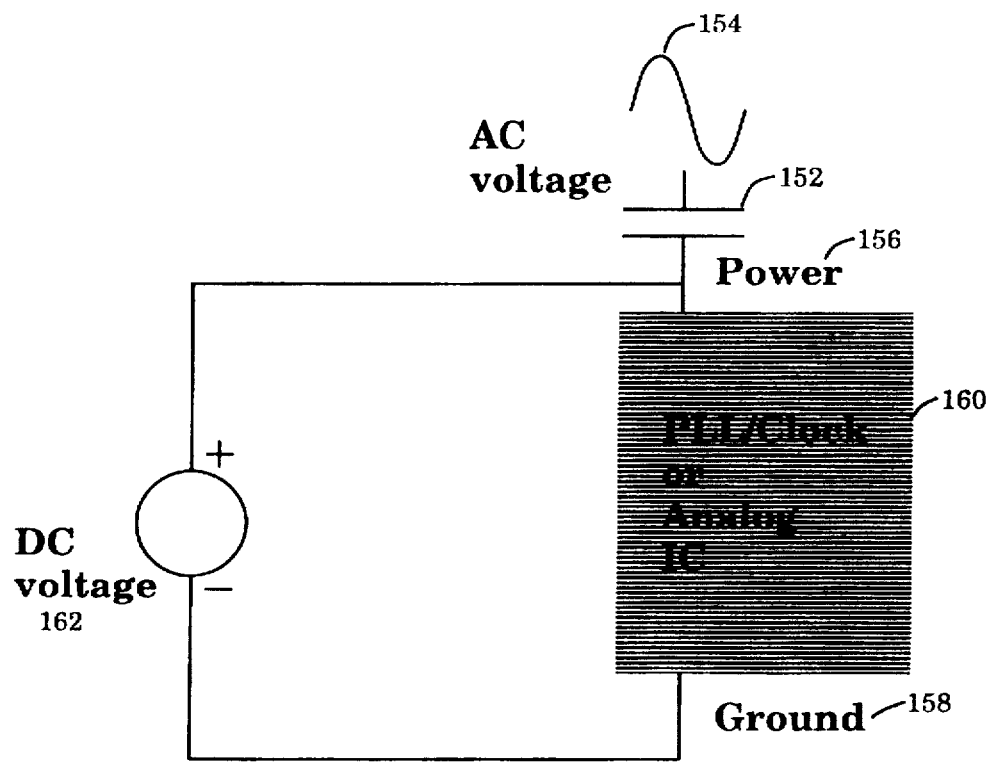
FIG. 1B illustrates a noise injection circuit, which injects noise through a capacitor.
Figure 2:
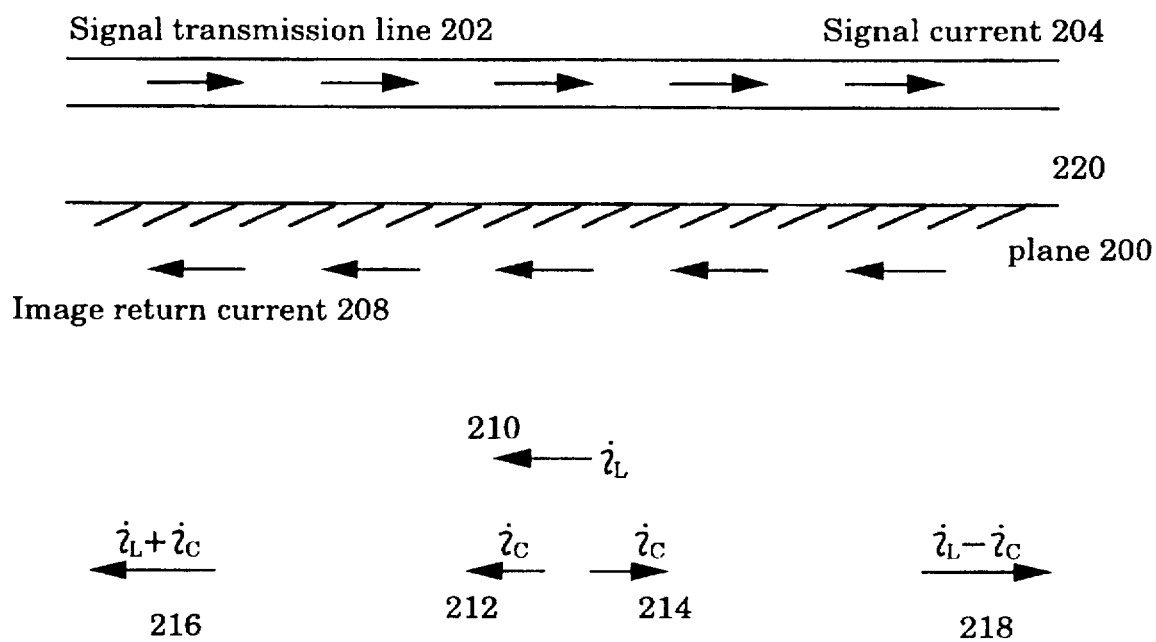
FIG. 2 illustrates how an image return current is generated on an exemplary plane.

FIG. 2 illustrates how an image return current is generated on an exemplary plane 200. A transmission line 202 such as a microstrip or a stripline passes over the plane 200, which may be a power plane or ground plane. An exemplary dielectric material 220 may be disposed between the transmission line 202 and the plane 200. The transmission line 202 carries an AC signal current 204 over the plane 200 in parallel. This AC signal current 204 induces an image return current 208 on the plane 200.

The image return current 208 consists of a magnetic (i.e., inductive) current, $i_L$ 210, and an electric (i.e., capacitive) current, $i_c$ 212 and 214. The magnetic component of the image current, $i_L$ 210, is induced in the opposite direction relative to the signal path and flows underneath the signal line 202 in the plane. According to Faraday's law of induction, induced current in a circuit is equal to the changing rate of the flux through the circuit. Hence, as a wavefront of the AC signal current 204 propagates along the signal transmission line 202, a magnetic image return current, $i_L$ 210, is induced beneath the signal line 202 on the plane 200. The direction of this induced current is given by Lenz's law: The induced current will appear in such a direction that it opposes the change that produced it. Consequently, the direction of the induced current is in the opposite direction to the signal path of the AC signal current 204.

In contrast, the electric or capacitive image current, $i_c$ 212 and 214, flows radially outward in two dimensions from the point on the plane 200 underneath the signal line where the signal wavefront propagates. Since magnetic and electric fields are inversely proportional to the distance from a transmission line, the magnetic and electric image current amplitudes are inversely proportional to the distance from the transmission line.

With reference still to FIG. 2, the electromagnetic wave of the image return current thus generated is relatively large in voltage due to addition and subtraction of magnetic and electric components of the image return current 208. That is, the magnetic image current, $i_L$ 210, and electric image current, $i_c$ 212, add on the left side 216 of the transmission line. On the right side 218 of the transmission line, the magnetic image current, $i_L$ 210, and electric image current, $i_c$ 214, subtract. The addition and subtraction of the magnetic and electric image currents generate a potential difference along the plane. This difference in potential along the plane causes a wavefront to be created on the plane, thereby generating noise.

Figure 3:
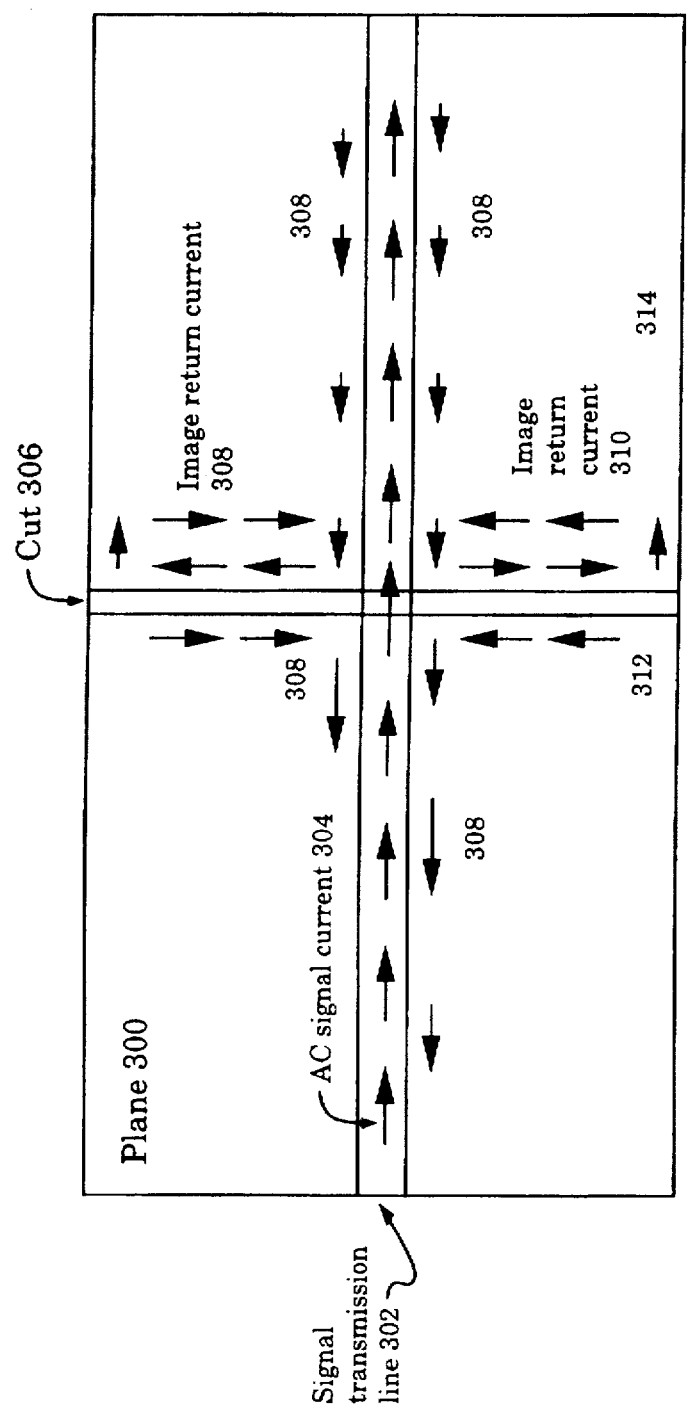
FIG. 3 illustrates the effect of a cut on image return currents in an exemplary plane.

FIG. 3 illustrates the effect of a cut 306 on image return currents 308 and 310 in an exemplary plane 300. The cut 306 (i.e., slit) is made on the plane 300 and is orthogonal to the transmission line 302 (i.e., signal line) carrying the AC signal current 304. The orthogonal cut 306 disrupts the image return currents 308 and 310 induced from the AC signal current 304. This results in a modification of the flux loop area encompassing the AC signal current 304 and the image return currents 308 and 310. Due to the gap created by the cut 306, the image return currents 308 and 310 are no longer able to flow continuously across the plane. In addition, some charges build up on both sides 312 and 314 of the cut 306 on the plane 300.

Faced with the barrier presented by the cut 306, the image return currents 308 and 310 in the vicinity of the cut 306 are forced to flow in both directions along the cut 306 on the plane 300. Specifically, on the right side 314 of the plane 300, the image return current 308 in the upper half of the plane 300 flows up and reflects back down. The image return current 310 in the lower half of the plane 300 flows down and reflects back up. On the other side 312 of the cut 306, the direction of the image return current flow is reversed. The image return current 308 in the upper half of the plane 300 flows down along the edge of the cut 306 while the image return current 308 in the lower half flows up along the edge of the cut 306.

Based on these observations, the present invention utilizes a plurality of cuts on a power plane and a ground plane to generate noise. A noise generating apparatus of the present invention is preferably implemented in a PWB. The PWB includes a power plane, a ground plane, and a transmission line. The power and ground planes themselves are a type of radial transmission lines and form AC ground planes. The transmission line passes over the ground plane and the power plane. In a PWB, the transmission line can be implemented as a microstrip or stripline. A signal current in the transmission line induces an image return current in the ground plane and power plane. It should be appreciated that the present invention can be practiced by utilizing a plurality of power and ground planes, and a plurality of transmission lines.

A plurality of cuts are made on the power and ground planes to disrupt the image current flow in order to disrupt the flow of image return currents. Preferably, the specified pattern of cuts on the power and ground planes are of a serpentine pattern. This exemplary serpentine pattern provides a long pathway for an image current. This pattern thus allows more noise to be generated in the planes.

The serpentine pattern of the present embodiment enables generation of differential noise between a power plane and a ground plane. The noise generating apparatus produces high frequency noise on the radial transmission line (i.e., power or ground plane) by causing the image return currents to flow in a larger than normal loop area encompassing a signal and associated image return current. This large loop area creates pockets of potential differences which generates electromagnetic waves to propagate on the radial transmission line.

Figure 4A:
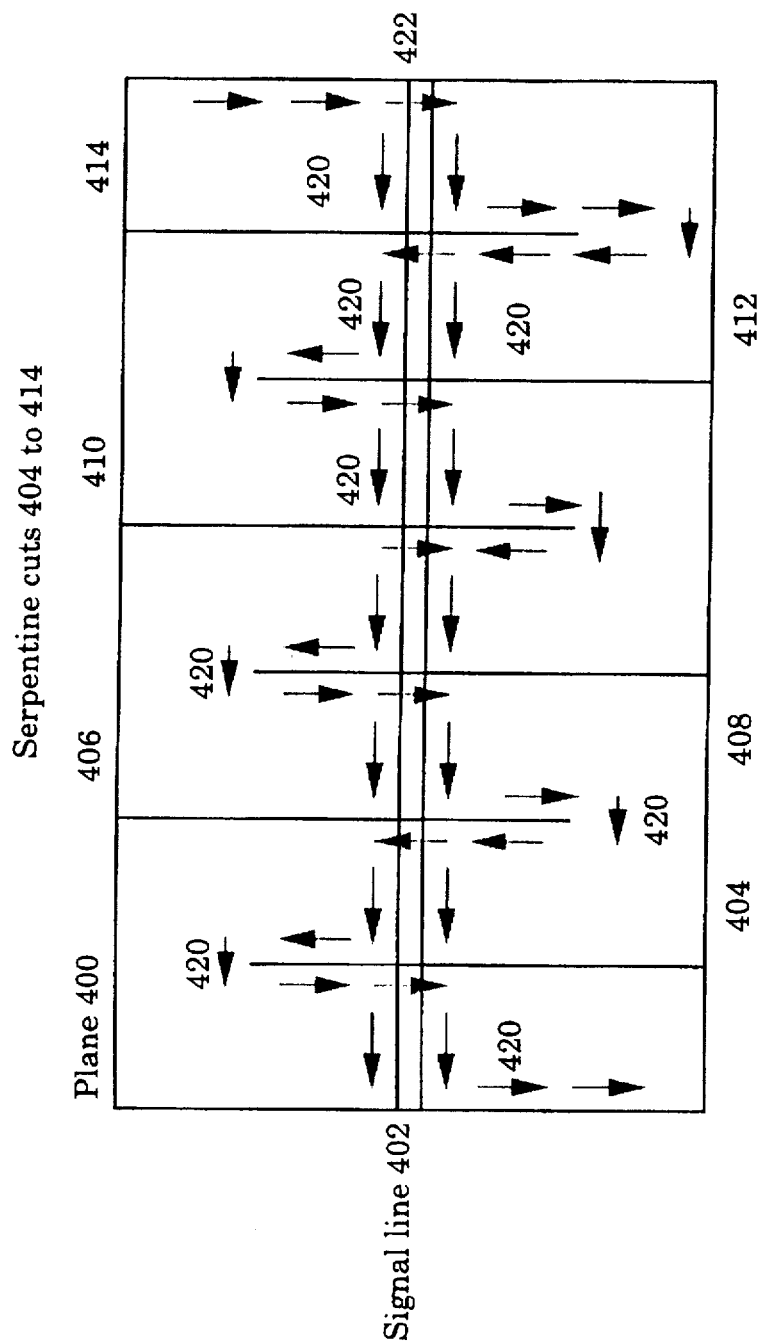
FIG. 4A illustrates the flow of image return currents on a plane with an exemplary serpentine pattern of cuts.

FIG. 4A illustrates the flow of image return currents 420 on a plane 400 with an exemplary serpentine pattern of cuts 404 to 414. An exemplary transmission line 402 such as a microstrip or stripline passes over the center of the plane and transmits an AC signal current 422. Preferably, the transmission line 402 is either unterminated at the far end (i.e., open) with the transmission line 402 having a characteristic impedance or terminated to a characteristic impedance to match the impedance of the AC signal generator. These exemplary impedance matching techniques in driving a signal through a transmission line are well known in the art.

In response to the AC signal current on the transmission line 402, the image return currents 420 are generated. The flow of the image return currents 420 is along the serpentine ground pattern as indicated by the associated arrows. The serpentine cuts 404 to 414 in the exemplary plane disrupt the image return current path from its normal flow. The image return current is thus forced to flow around the cuts, thereby creating a wavefront on the plane. This wavefront is not normally associated with a normal signal transmission line, and creates an electromagnetic wave that propagates along the plane at the same frequency as the signal transmission line.

Electromagnetic waves thus generated are relatively large in voltage due to addition and subtraction of magnetic and electric components of the image return current as described above. The magnetic and electric components of the image return current add on the sides toward the origin of the signal path in the signal transmission line. On the other sides toward the end of the signal transmission line, the magnetic and electric image return currents subtract. The addition and subtraction of the magnetic and electric image return currents generate a potential difference along the plane and cause a wavefront to be generated on the plane. This wavefront on the plane comprises a high frequency voltage noise.

Figure 4B:
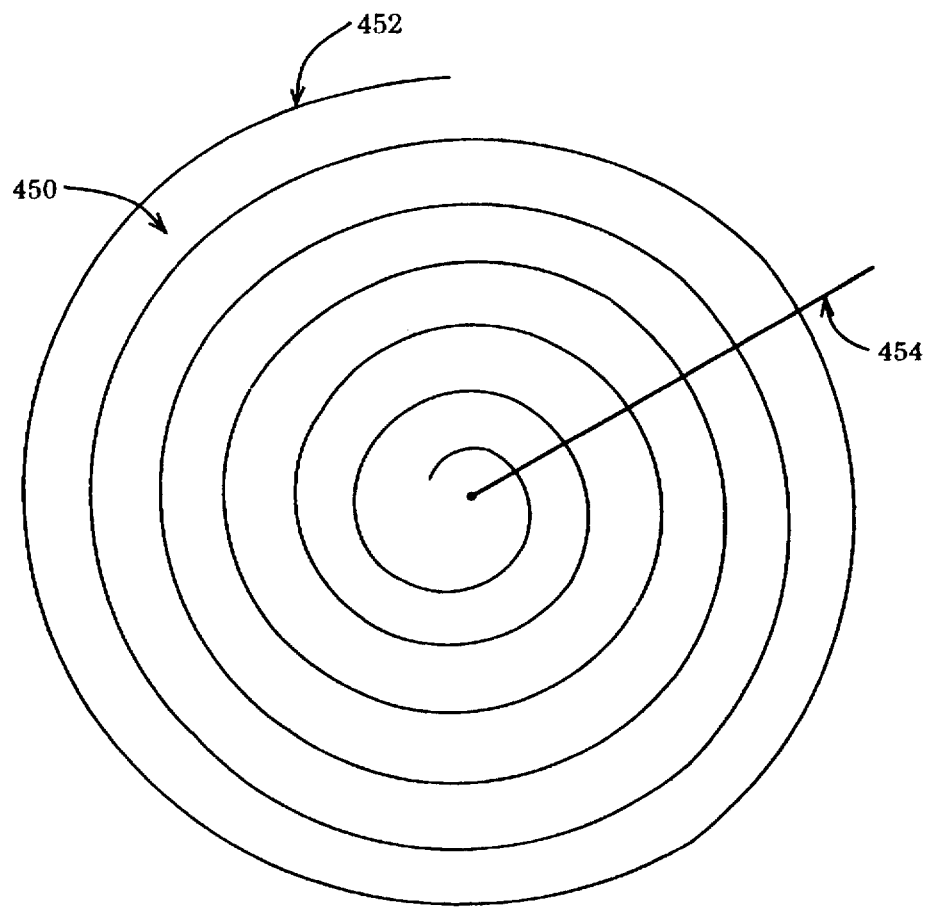
FIG. 4B illustrates a spiral pattern on an exemplary plane.

Although a serpentine pattern is used in a preferred embodiment of the present invention, it should be appreciated that other two dimensional and three dimensional patterns allowing a pathway for image current flow are also well suited for generating noise on the ground and power planes, including but not limited to spiral and helical patterns. For example, an alternative embodiment of the present invention utilizes a spiral pattern on an exemplary plane as illustrated in FIG. 4B. A spiral cut pattern 452 is made on the exemplary plane 450. A signal transmission line 454 is disposed over the spiral cut pattern 452. Preferably, the spiral pattern is utilized on a circular plane or PWB.

Another alternative embodiment of the invention features a three dimensional helix pattern utilizing a plurality of ground and power planes. In this configuration, a ground plane and a power plane, each with a portion of helix pattern, are paired with one another. Taken together, these planes form a helix pattern of cuts. Further, a series of ground and power plane pairs, each plane with a portion of helix pattern, may be stacked on top of one another to form multiple layers. Preferably, the helix pattern of cuts is utilized on circular planes or PWBs.

Figure 5:
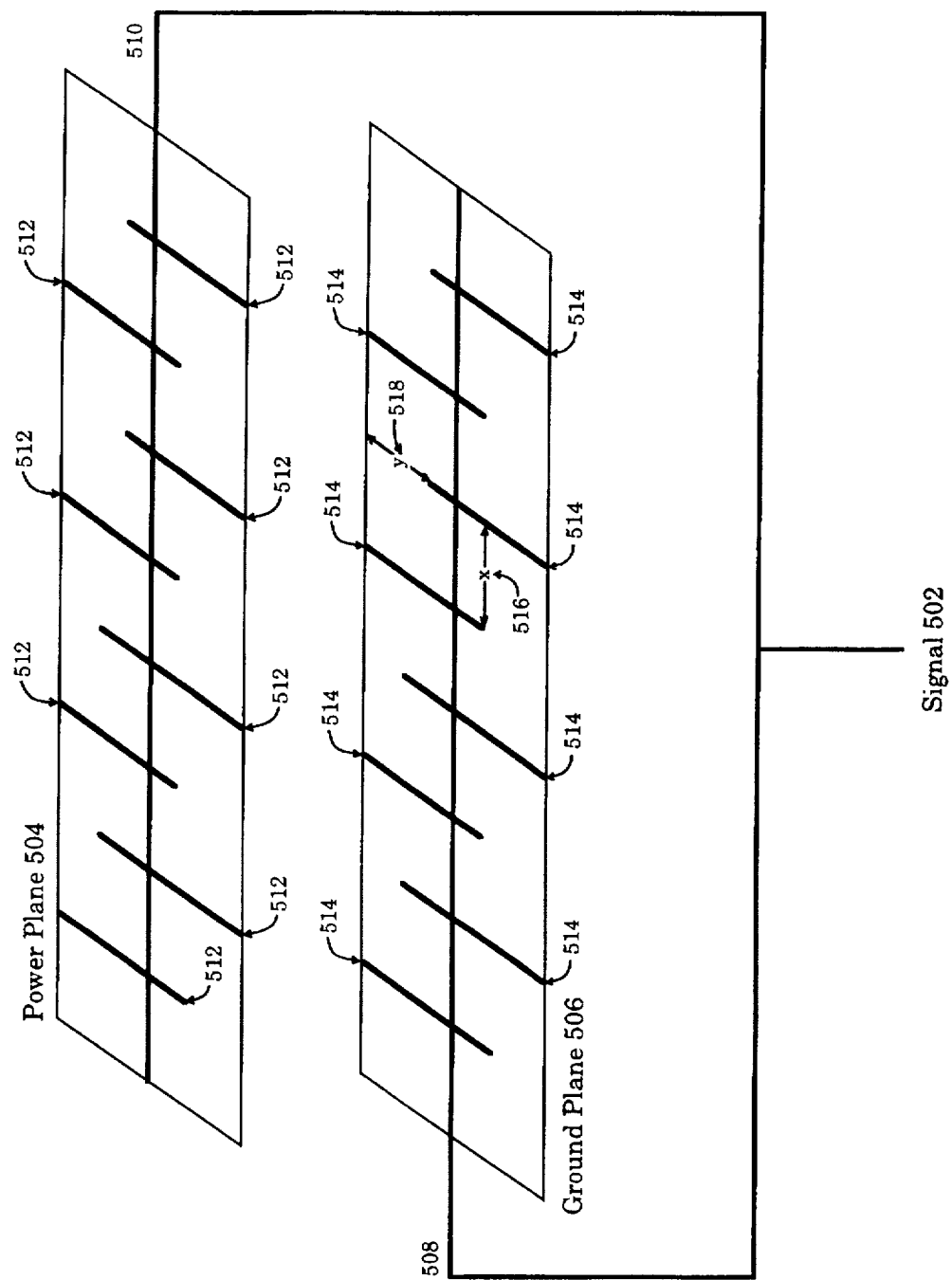
FIG. 5 illustrates a perspective view of a noise generating apparatus according to a preferred embodiment of the present invention.

FIG. 5 illustrates a perspective view of a noise generating apparatus according to a preferred embodiment of the present invention. The apparatus consists of transmission lines 508 and 510, a power plane 504, and a ground plane 506. The power plane 504 and ground plane 506 are preferably in parallel alignment, one directly over the other. The signal transmission lines 508 and 510 transmit a signal 502, preferably an AC signal. The signal transmission lines 508 and 510 for both the ground plane 506 and the power plane 504, respectively, are orthogonal to the serpentine patterns of cuts 512 and 514 on the power plane 504 and the ground plane 506, respectively. In one embodiment of the invention, the serpentine patterns of cuts 512 and 514 on the planes are identical.

In order to ensure maximum noise generation, the dimensions between the planes and signal transmission lines should be sufficient to reduce unwanted effects from coupling and crosstalk. For example, the distance between signal transmission lines 508 and 510 should be large enough to prevent crosstalk between the lines. In addition, the distance between the power plane 504 and the ground plane 506 should be designed to prevent coupling between the planes. According to a preferred embodiment of the invention, the distance between the planes is larger than the distance between a plane and its associated signal transmission line.

The noise generated in the configuration of FIG. 5 is differential noise between the power plane 504 and the ground plane 506. Since the signal currents in transmission lines 508 and 510 are in opposite direction, noise is generated in the opposite directions on each plane at the same frequency at a particular location on the planes. Hence, the differential noise comprised of the difference in voltage noise amplitude between the planes is typically twice as large as a single plane configuration.

Furthermore, the differential noise generated between the power plane 504 and the ground plane 506 is deterministic. That is, the output noise can be controlled in amplitude and frequency by adjusting the amplitude and frequency of the signal current amplitude and frequency. The length of the cuts and width of the cuts of the pattern can also be optimized for specific fundamental frequencies. In general, more noise is generated when a plane contains more instances of cuts beneath a signal transmission line. The width and the length of the cuts also influence the noise generation due to the resonant length effects at specific frequencies. It should be obvious to one skilled in the art that the cut widths and lengths can be optimized for specific frequency ranges.

In an alternative embodiment of the present invention, the noise amplitude may be controlled deterministically by providing a switch across a portion of a gap in a cut or slit forming a pattern. The switch may be implemented as an active component such as a field effect transistor (FET) or as a passive switch or relay. The switch acts as a bridge and conducts image return currents across the gap. This allows control of the image return current loop or path at various points in the cut. Since noise generated is related to the image return current path, its amplitude can be controlled by bridging gaps at strategic locations to control the image return current path.

Figure 6:
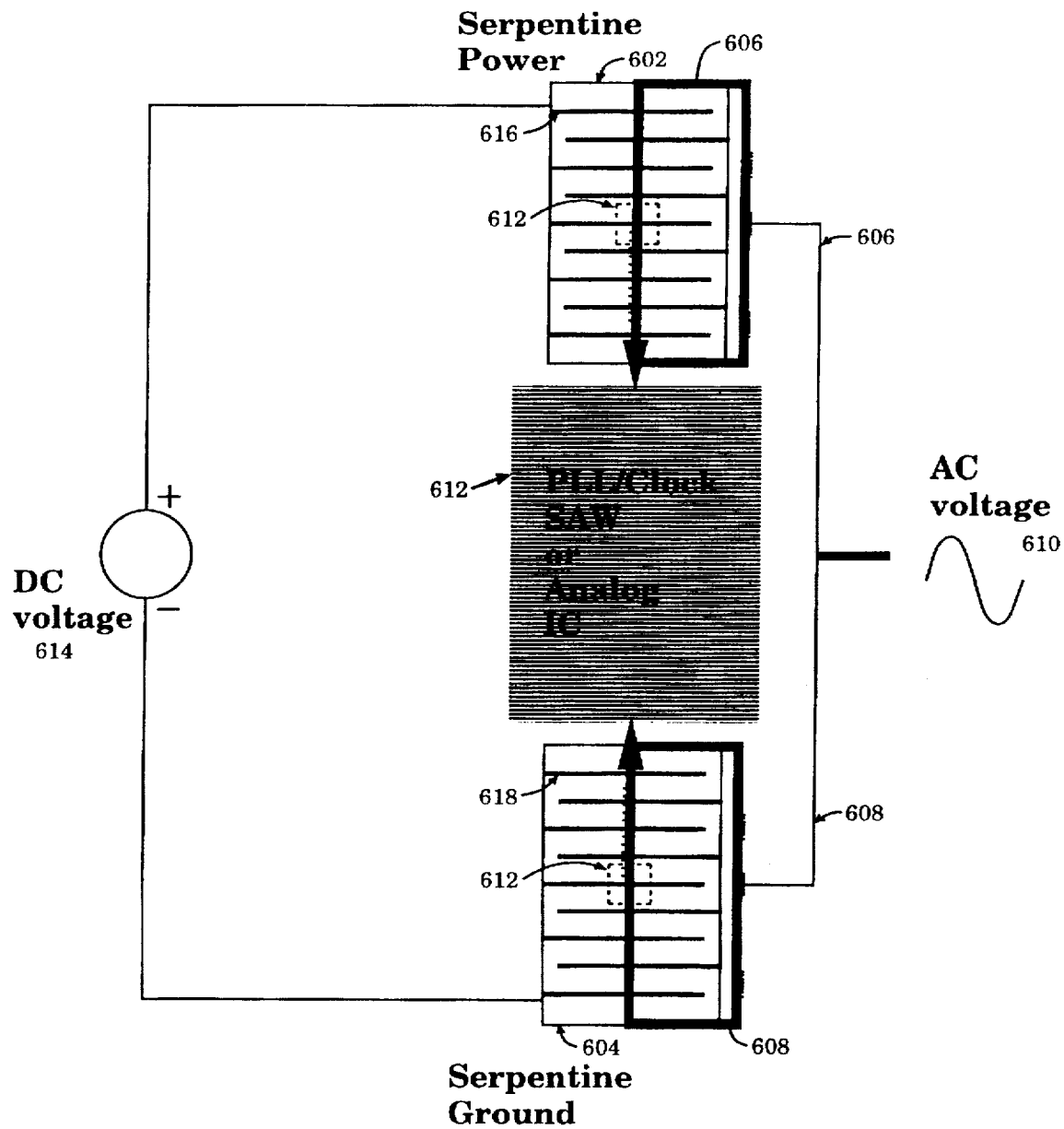
FIG. 6 illustrates a noise generating apparatus implemented in testing frequency sensitivity of an analog component.

FIG. 6 illustrates a noise generating apparatus implemented in testing frequency sensitivity of an analog component such as PLLs, clocks, SAW devices, and other analog ICs. In this circuit configuration, an AC voltage signal 610 is fed into two signal transmission lines 606 and 608. One signal transmission line 606 passes over and across a power plane 602 and the other signal transmission line 608 passes over and across a ground plane 604. Hence, both signal transmission lines 606 and 608 transmit identical signals with same frequency and amplitude. Although the power plane 602 and the ground plane 604 are depicted in FIG. 6 as separate, it should be noted that both planes are actually disposed in a PWB. The signal transmission lines 606 and 608 lie between the planes in the PWB. Serpentine cuts 616 and 618 are made in both the power plane 602 and the ground plane 604. The serpentine pattern enables an image return current to be generated from the signal.

In general, more noise is generated along the area on a plane directly beneath a transmission line because the induced magnetic and electric fields are inversely proportional to the distance from the transmission line.

According to a preferred implementation of the present invention, the analog component 612 to be tested is placed in the center area on the PWB corresponding to the center area of the power and ground planes. This is because the center area of a serpentine ground and power planes usually generates the most deterministic and the largest noise amplitude. In this implementation, the analog component is electrically coupled to the power and ground planes. The dotted arrows originating from the center of the power plane 606 and ground plane 608 indicate that the analog component 612 is disposed in the center area of the planes and PWB. When differential noise is generated between the power plane 602 and the ground plane 604, it is injected into the analog component 612 situated in the center.

Noise generation and injection are useful for clock distribution and signal integrity analysis to determine system timing and noise margins. This invention provides significant functional and performance capabilities beyond conventional noise injection techniques. The circuit is useful for testing clock distribution components such as PLLs, oscillators including crystal and SAW devices, delay lines, and other components that are sensitive to noise. In addition, the present apparatus is useful for applications where injection of deterministic and controllable high frequency noise on power and ground planes is desired. Those skilled in the art will no doubt recognize that this apparatus can also be extended to multiple power and ground plane system configurations and for injection of a single power or ground plane.

The present invention, an apparatus for generating differential noise between power and ground planes, utilizes a pattern of cuts on the power and ground planes to generate noise. While the present invention has been described in particular embodiments, it should be appreciated that the present invention should not be construed as being limited by such embodiments, but rather construed according to the claims below.

What is claimed is:

1. An apparatus for generating a differential noise on a printed wiring board (PWB), comprising:
    a power plane disposed in the PWB, said power plane having a plurality of cuts comprising a first pattern;
    a ground plane disposed in the PWB, said ground plane having a plurality of cuts comprising a second pattern;
    a circuit for inducing an image return current on the power plane and the ground plane, wherein the first and second patterns of cuts on the power plane and the ground plane disrupt the image return current and cause a differential voltage noise to be generated between the power plane and the ground plane.

2. The apparatus as recited in claim 1, wherein the first pattern and the second pattern are identical.

3. The apparatus as recited in claim 2, wherein the first pattern and the second pattern are serpentine pattern.

4. The apparatus as recited in claim 2, wherein the first pattern and the second pattern are spiral pattern.

5. The apparatus as recited in claim 2, wherein the first pattern and the second pattern are helix pattern.

6. The apparatus as recited in claim 3, wherein the circuit further comprises:
    a first transmission line disposed over the power plane such that the first transmission line transmits a signal current over the power plane; and
    a second transmission line disposed over the ground plane such that the second transmission line transmits the signal current over the power plane.

7. The apparatus as recited in claim 6, wherein the cuts in the first pattern and the second pattern are orthogonal to the direction of the signal current.

8. The apparatus as recited in claim 6, wherein the image return current further comprises:
    a first image return current induced by the signal current on the first transmission line; and
    a second image return current induced by the signal current on the second transmission line.

9. The apparatus as recited in claim 6, wherein both the first transmission line and the second transmission line are microstrips.

10. The apparatus as recited in claim 6, wherein both the first transmission line and the second transmission line are striplines.

11. The apparatus as recited in claim 6, wherein the first transmission line and the second transmission line are both coupled to an AC signal source, wherein an identical AC signal from the AC signal source is transmitted to the first transmission line and the second transmission line.

12. The apparatus as recited in claim 6, wherein the first transmission line is coupled to a first AC signal source and the second transmission line is coupled to a second AC signal source, wherein a first AC signal from the first AC signal source is transmitted to the first transmission line and a second AC signal from the second AC signal source is transmitted to the second transmission line.

13. The apparatus as recited in claim 11, wherein the frequency of the AC signal determines the frequency of the differential voltage noise.

14. The apparatus as recited in claim 11, wherein the amplitude of the AC signal determines the amplitude of the differential voltage noise.

15. The apparatus as recited in claim 11, wherein the dimensions of the cuts comprising the first pattern on the power plane and the second pattern on the ground plane determine the amplitude of the differential voltage noise.

16. The apparatus as recited in claim 6, wherein both the first transmission line and the second transmission line are disposed in the PWB.

17. The apparatus as recited in claim 16, wherein the first transmission line and the second transmission line are disposed between the power plane and the ground plane.

18. The apparatus as recited in claim 1, wherein the ground plane and the power plane include a switch across the cuts to control the amplitude of the differential voltage noise.

19. The apparatus as recited in claim 1, wherein the power plane is coupled to a first voltage and the ground plane is coupled to a second voltage.

20. The apparatus as recited in claim 19, wherein a DC voltage is applied across the first voltage and the second voltage.

21. An apparatus for generating a differential noise on a printed wiring board (PWB), comprising:

a power plane disposed in the PWB, said power plane having a plurality of cuts comprising a first pattern;

a ground plane disposed in the PWB, said ground plane having a plurality of cuts comprising a second pattern;

a signal transmission circuit for transmitting a signal current over the ground plane and the power plane wherein the signal current induces an image return current on both the power plane and the ground plane, wherein the first and second patterns of cuts on the power plane and the ground plane, respectively, disrupt the image return current and cause a differential voltage noise to be generated between the power plane and the ground plane.

22. The apparatus as recited in claim 21, wherein the signal transmission circuit further comprises:

a first transmission line disposed over the power plane such that the first transmission line transmits the signal current over the power plane; and a second transmission line disposed over the ground plane such that the second transmission line transmits the signal current over the power plane.

23. The apparatus as recited in claim 22, wherein the cuts in the first pattern and the second pattern are orthogonal to the direction of the signal current.

24. The apparatus as recited in claim 22, wherein the first pattern and the second pattern are identical.

25. The apparatus as recited in claim 24, wherein the first pattern and the second pattern are serpentine pattern.

26. The apparatus as recited in claim 24, wherein the first pattern and the second pattern are spiral pattern.

27. The apparatus as recited in claim 24, wherein the first pattern and the second pattern are helix pattern.

28. The apparatus as recited in claim 23, wherein the image return current further comprises:

a first image return current induced by the signal current on the first transmission line; and a second image return current induced by the signal current on the second transmission line.

29. The apparatus as recited in claim 23, wherein both the first transmission line and the second transmission line are microstrips.

30. The apparatus as recited in claim 23, wherein both the first transmission line and the second transmission line are striplines.

31. The apparatus as recited in claim 23, wherein the first transmission line and the second transmission line are both coupled to an AC signal source, wherein an identical AC signal from the AC signal source is transmitted to the first transmission line and the second transmission line.

32. The apparatus as recited in claim 23, wherein the first transmission line is coupled to a first AC signal source and the second transmission line is coupled to a second AC signal source, wherein a first AC signal from the first AC signal source is transmitted to the first transmission line and a second AC signal from the second AC signal source is transmitted to the second transmission line.

33. The apparatus as recited in claim 31, wherein the frequency of the AC signal determines the frequency of the differential voltage noise.

34. The apparatus as recited in claim 31, wherein the amplitude of the AC signal determines the amplitude of the differential voltage noise.

35. The apparatus as recited in claim 21, wherein the dimensions of the cuts comprising the first pattern on the power plane and the second pattern on the ground plane determine the amplitude of the differential voltage noise.

36. The apparatus as recited in claim 22, wherein both the first transmission line and the second transmission line are disposed in the PWB.

37. The apparatus as recited in claim 36, wherein the first transmission line and the second transmission line are disposed between the power plane and the ground plane.

38. The apparatus as recited in claim 21, wherein the ground plane and the power plane include a switch across one of the plurality of cuts to control the amplitude of the differential voltage noise.

* * * * *